United States Patent [19]

Higashi

[11] Patent Number: 5,128,536
[45] Date of Patent: Jul. 7, 1992

[54] ABNORMALITY PROCESSING CIRCUIT FOR AN ENCODER

[75] Inventor: Kouichi Higashi, Iruma, Japan

[73] Assignee: Kabushiki Kaisha Yaskawa Denki Seisakusho, Kitakyushu, Japan

[21] Appl. No.: 651,376

[22] PCT Filed: Jun. 29, 1990

[86] PCT No.: PCT/JP90/00848
§ 371 Date: Feb. 26, 1991
§ 102(e) Date: Feb. 26, 1991

[87] PCT Pub. No.: WO91/00499
PCT Pub. Date: Jan. 10, 1991

[30] Foreign Application Priority Data

Jun. 30, 1989 [JP] Japan ................. 1-166781

[51] Int. Cl.⁵ ............................... G01D 5/34
[52] U.S. Cl. ..................... 250/231.16; 250/231.13; 250/231.14; 250/231.17; 250/231.18
[58] Field of Search ............ 250/231.16, 231.14, 250/231.17, 231.18, 231.13

[56] References Cited

U.S. PATENT DOCUMENTS

| | | | |
|---|---|---|---|
| 4,079,251 | 3/1978 | Osann, Jr. | 250/231.16 |
| 4,233,592 | 11/1980 | Leichle | 340/347 P |
| 4,600,835 | 7/1986 | Ishida et al. | 250/231.16 |
| 4,678,948 | 7/1987 | Schmitt | 307/511 |

FOREIGN PATENT DOCUMENTS

| | | |
|---|---|---|
| 0133199 | 2/1985 | European Pat. Off. |
| 60-21413 | 2/1985 | Japan |
| 62-93618 | 4/1987 | Japan |
| 62-285009 | 12/1987 | Japan |

Primary Examiner—Constantine Hannaher
Attorney, Agent, or Firm—Oblon, Spivak, McClelland, Maier & Neustadt

[57] ABSTRACT

An encoder of the invention comprises: an abnormality detecting circuit for detecting an abnormal state of an encoder main body; and a circuit which inverts a part of output signals of the encoder main body and outputs or does not output a part of the output signals of the encoder main body in response to an abnormality detection signal which is output from the abnormality detecting circuit when the encoder main body is abnormal. Thus, the occurrence of the abnormality of the encoder main body can be detected from the outside.

1 Claim, 4 Drawing Sheets

ABNORMALITY PROCESSING CIRCUIT FOR AN ENCODER

TECHNICAL FIELD

The present invention relates to an encoder which is used to detect the position and velocity of an object.

BACKGROUND ART

Hitherto, for instance, a rotary encoder has been used to detect the revolution angle and revolution speed of a motor or the like; rotary encoders are mainly classified as incremental encoders and absolute encoders. In the incremental encoder generates pulses of the number corresponding to the number of divided sections which are obtained by dividing one revolution range of a motor or the like at regular intervals, and a signal processing circuit counts the number of pulses, so that the rotational position or revolution speed of the motor or the like can be determined. The incremental encoder ordinarily outputs pulse signals of two phases, A and B, having a phase difference of 90°; the direction of rotation (forward rotation or reverse rotation) of the motor or the like is discriminated by the phase relation (advance or delay). On the other hand, generally, one origin pulse (Z-phase pulse signal) is output during one revolution as a reference signal indicative of one revolution. The absolute encoder uses a code plate in which the absolute position in one revolution range of a motor or the like is expressed by a binary code. A parallel output type, an output type of A and B phases, and the like are known as output types. On the other hand, there are also an absolute encoder of the memory backup type in which the number of revolutions of a motor or the like is recorded by using a memory which uses a battery as a backup power source and an absolute encoder of the multi-rotation type in which an absolute position of one revolution or more of a motor or the like is also produced by using a reduction mechanism using a gear or the like.

DISCLOSURE OF INVENTION

The above-mentioned conventional encoders have the following drawbacks. In the case where an abnormality such that part of signals in the encoder are missing, the output signal generally become abnormal. However, whether an abnormality has occurred or not cannot be discriminated from the outside of the encoder. On the other hand, a case where no abnormality appears in the output signal also occurs on rare occasions. Further, even in the case where an instantaneous power failure has occurred, although the output signal generally becomes abnormal, such an abnormality of the output signal is usually momentary and, after that, the signal falsely becomes a normal signal. Consequently, the abnormality of the encoder cannot be detected from the outside. In the above cases, a runaway of the apparatus and, further, a breakdown of the apparatus are eventually caused. Particularly, in the multi-rotation type absolute encoder of the memory backup type using a battery, there is a drawback such that if the content of the memory is interfered with a disconnection of the battery or the like, the amount of errors increases and a serious problem is caused.

It is an object of the invention to provide an encoder which can prevent a runaway and a breakdown of the apparatus by informing the occurrence of abnormality to the outside when an abnormality occurrs.

A first encoder of the invention comprises: an encoder main body for producing and outputting pulse signals of a plurality of phases in association with a linear movement or a revolution of an object; an abnormality detecting circuit for detecting an abnormality of the encoder main body and outputting an abnormality detection signal; and a gate circuit for receiving the pulse signal of a certain phase among the pulse signals, for outputting the pulse signal when the encoder main body is normal, and for inverting the pulse signal and outputting the inverted pulse signal when the abnormality detection signal is output.

A second encoder of the invention comprises: an encoder main body for producing and outputting pulse signals of a plurality of phases in association with a linear movement or a revolution of an object; an abnormality detecting circuit for detecting an abnormality of the encoder main body, for outputting an abnormality detection signal, and for executing a procedure indicated by an external command signal when the external command signal is input; and a transceiver circuit which is constructed in a manner such that the pulse signal of a certain phase among the pulse signals is input and when the encoder main body is normal, the transceiver circuit is set into an output mode and outputs the pulse signal, and when the abnormality detection signal is output, the transceiver circuit is set into an input mode, and when the external command signal appears on an output signal line of the pulse signal, the transceiver circuit receives the external command signal and outputs it to the abnormality detecting circuit.

A third encoder of the invention comprises: an encoder main body for producing and outputting pulse signals of a plurality of phases in association with a linear movement or a revolution of an object; and abnormality detecting circuit for detecting an abnormality of the encoder main body and for outputting an abnormality detection signal and an abnormality discrimination signal indicative of the content of the abnormality; and a selector circuit for receiving the pulse signal of a certain phase among the pulse signals, for outputting the pulse signal when the encoder main body is normal, and for outputting the abnormality discrimination signal in place of the pulse signal when the abnormality detection signal is output.

When an abnormality of the encoder main body is detected by the abnormality detecting circuit, either one of the pulse signals which were output from the encoder main body is inverted or the output of either one of the pulse signals is stopped, thereby enabling the abnormality of the encoder main body to be detected from the outside of the encoder main body. The operator can stop the apparatus and can prevent a runaway or a breakdown of the apparatus. On the other hand, by outputting the abnormality discrimination signal, the content of the abnormality can be known. Further, a command of a procedure corresponding to the abnormal state can be input from the outside. On the other hand, after completion of the procedure for the abnormal state, a reset signal is generated by using an operation to again turn on the power source and the abnormality detection signal can be also reset.

DETAILED DESCRIPTION OF THE PREFERRED EMBODIMENTS

Figure 1:
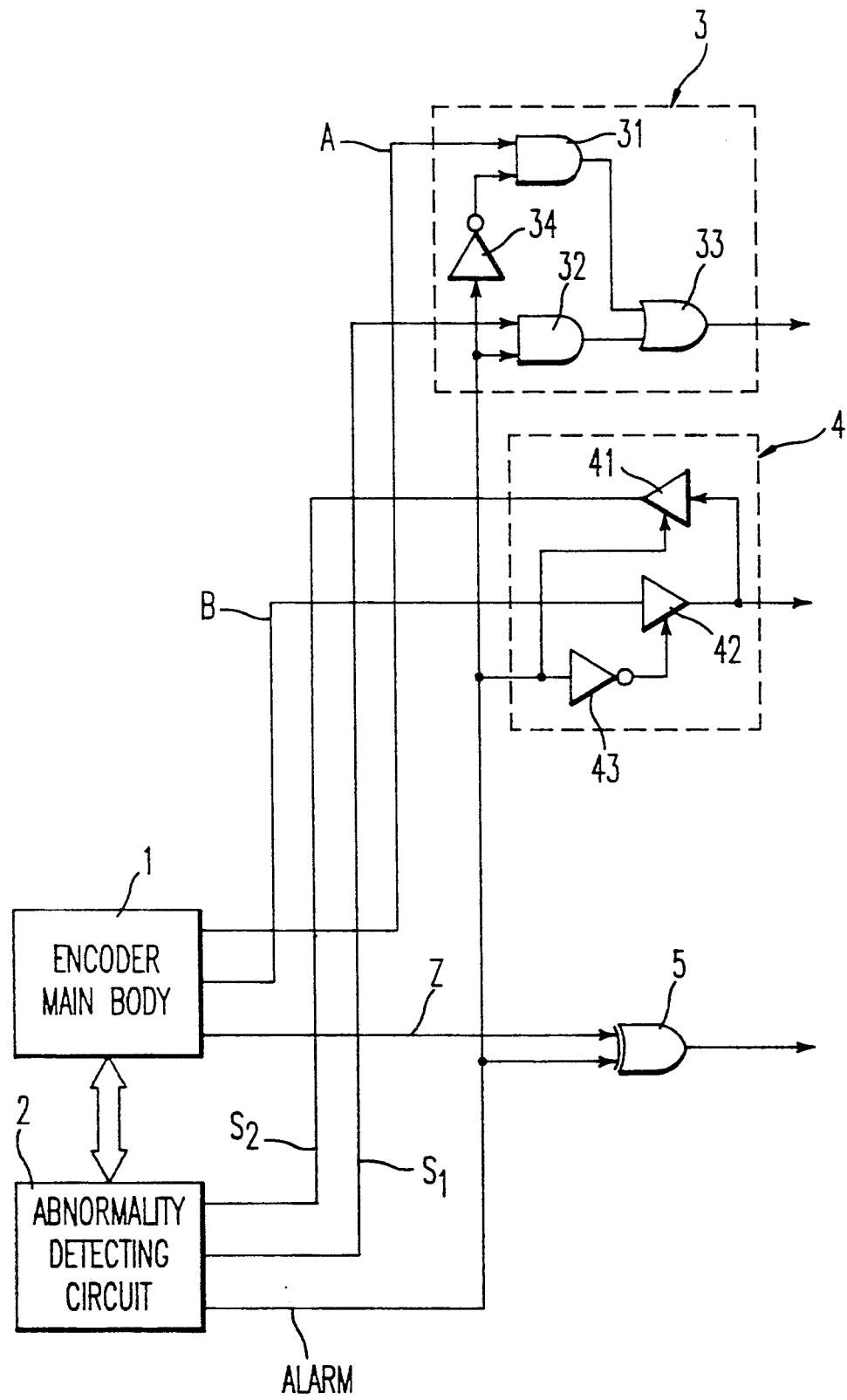
FIG. 1 is a circuit diagram showing a construction of a first embodiment of an encoder of the invention.
Figure 2A:
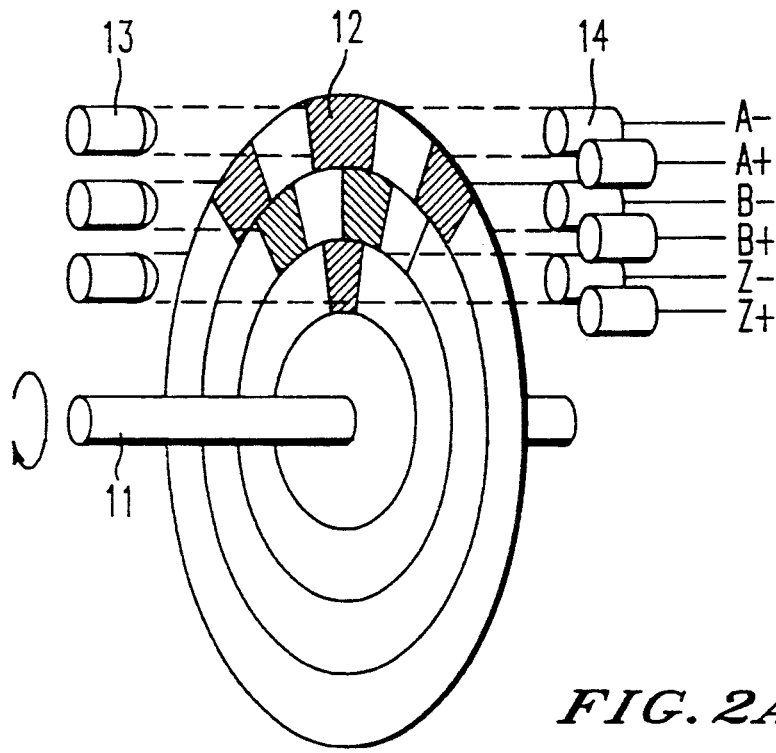
FIG. 2A is a constructional diagram of an encoder main body 1 in FIG. 1.
Figure 2B:
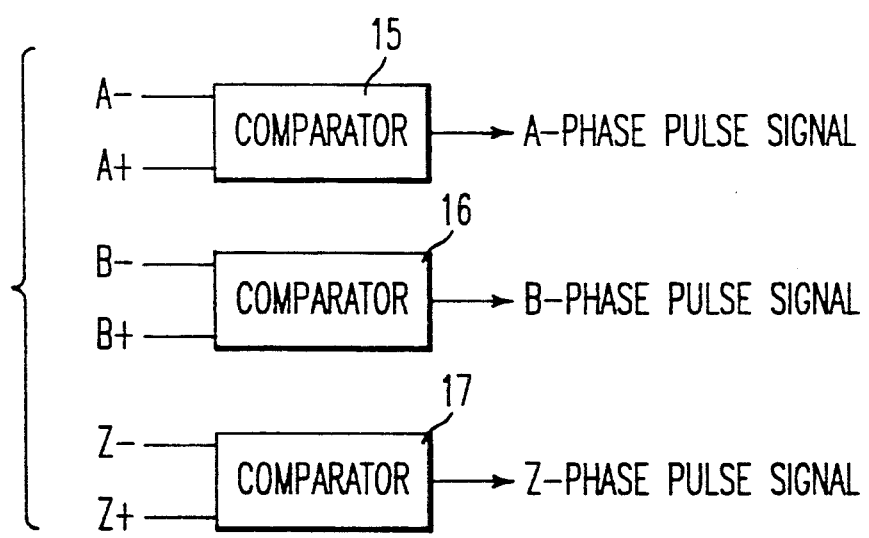
FIG. 2B is a circuit diagram of the encoder shown in FIG. 2A depicting the comparators 15, 16 and 17 with their respective input and output signals shown.
Figure 3:
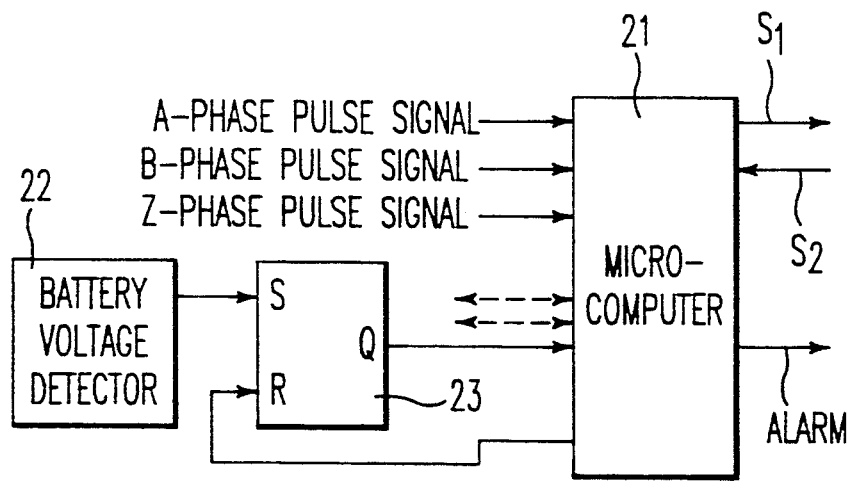
FIG. 3 is a block diagram showing a construction of an abnormality detecting circuit 2 in FIG. 1.
Figure 4:
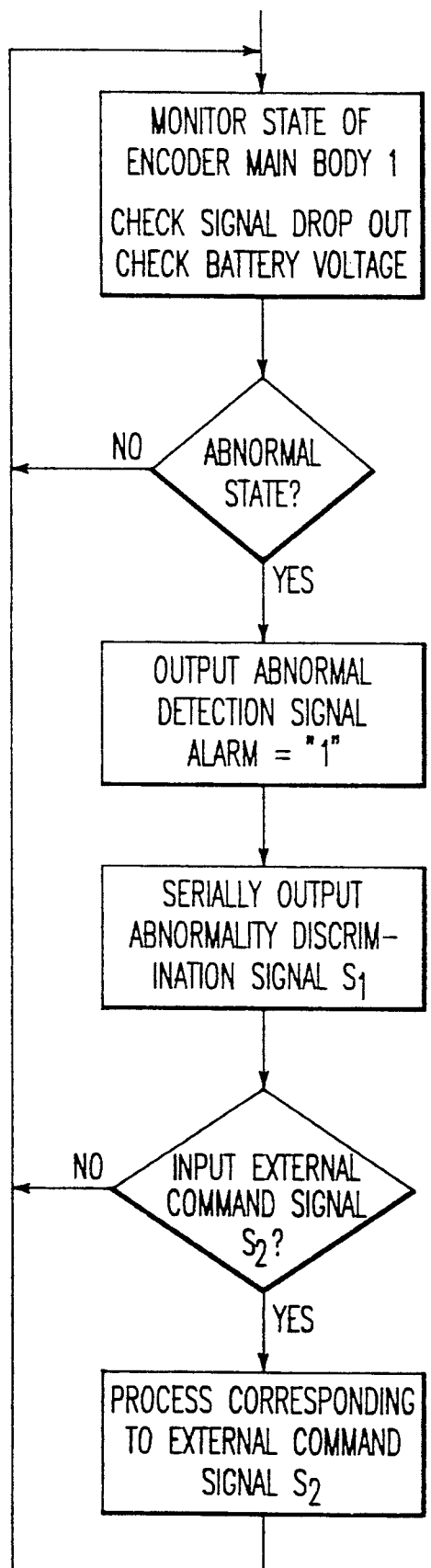
FIG. 4 is a flowchart showing internal procedures of a microcomputer 21 in FIG. 3.

An encoder main body 1 is a portion corresponding to a conventional encoder and has a well-known construction comprising: a disk 12 attached to a shaft 11; LEDs 13; photodiodes 14; and comparators 15, 16, 17 as shown in FIGS. 2A and 2B. The encoder main body 1 outputs pulse signals of an A phase, a B phase, and a Z phase. As shown in FIG. 3, the abnormality detecting circuit 2 comprises a microcomputer 21 (8051 or the like made by Intel Co., Ltd.) with a serial communicating function, a battery voltage detector 22, and an R-S type flip-flop 23. As shown in FIG. 4, the microcomputer 21 receives the pulse signals of the A, B, and Z phases which were output from the encoder main body 1 and checks to see if a signal dropout has occurred or not by discriminating whether an origin counted from the A-phase pulse signal and the B-phase pulse signal coincides with an origin indicative of the Z-phase pulse signal or not. On the other hand, the microcomputer 21 checks to see if a decrease in power source voltage of the memory backup battery of the encoder main body 1 has been detected by the battery voltage detector 22 and the R-S type flip-flop 23 has been set (alarm state) or not. If the signal dropout and/or the voltage drop of the battery power source are/is detected, an abnormality detection signal ALARM is set to the level "1" and an abnormality discrimination signal $S_1$ indicative of the content of the abnormality is serially output. After that, if an external command signal $S_2$ has been input from the outside, a procedure corresponding to the input external command signal $S_2$ is executed (for instance, the R-S type flip-flop 23 is reset). A selecting circuit 3 comprises AND gates 31 and 32, an OR gate 33, and an inverter 34. The inverter 34 inverts the logic level of the abnormality detection signal ALARM from the abnormality detecting circuit 2. The AND gate 31 receives the A-phase pulse signal and an output of the inverter 34. The AND gate 32 receives the abnormality discrimination signal $S_1$ and the abnormality detection signal ALARM. The OR gate 33 receives output of the AND gates 31 and 32. When the abnormality detection signal ALARM is set to the level "0", that is, when the encoder main body 1 is normal, the A-phase pulse signal is output. When the abnormality detection signal ALARM is set to the level "1", that is, when the encoder main body 1 is abnormal, the abnormality discrimination signal $S_1$ is output. A transceiver circuit 4 comprises: an inverter 43; a 3-state buffer 41 to input a signal from the outside; and a 3-state buffer 42 to output the B-phase pulse signal from the encoder main body 1. The 3-state buffer 41 is on/off controlled by the abnormality detection signal ALARM from the abnormality detecting circuit 2. The 3-state buffer 42 is on/off controlled by the inverted signal of the abnormality detection signal ALARM obtained through the inverter 43 from the abnormality detecting circuit 2. An exclusive OR circuit 5 receives the Z-phase pulse signal from the encoder main body 1 and the abnormality detection signal ALARM and outputs the Z-phase pulse signal when the abnormality detection signal ALARM is set to the level "0". When the abnormality detection signal ALARM is set to the level "1", the exclusive OR circuit 5 inverts the Z-phase pulse signal and outputs the inverted Z-phase pulse signal.

The operation of the embodiment will now be described.

When the encoder main body 1 operates normally, the abnormality detection signal ALARM which is output from the abnormality detecting circuit 2 is set to the level "0". Therefore, the A-phase pulse signal which was output from the encoder main body 1 is output through the AND gate 31 and OR gate 33 in the selector circuit 3. On the other hand, since the 3-state buffer 42 is turned on, the transceiver circuit 4 is set to the output mode and the B-phase pulse signal which was output from the encoder main body 1 is output from the transceiver circuit 4. Further, the Z-phase pulse signal which was output from the encoder main body 1 is output from the exclusive OR circuit 5. As mentioned above, when the encoder main body 1 operates normally, the pulse signals of A, B, and Z phases are output to a signal processing circuit (not shown) and the position or speed is detected.

When the voltage of the memory backup battery then drops abnormally, this is detected by the battery voltage detector 22 and the R-S type flip-flop 23 is set. When the R-S type flip-flop 23 is set, the microcomputer 21 sets the abnormality detection signal ALARM to the level "1" and the abnormality discrimination signal $S_1$ indicative of the content of the abnormality is output. At this time, in the selector circuit 3, the output of the A-phase pulse signal is stopped by the AND gate 31 and, in place of it, the abnormality discrimination signal $S_1$ is output to the signal processing circuit through the AND gate 32 and OR gate 33. Therefore, the nature of the abnormality of the encoder main body 1 can be determined from the outside. On the other hand, when the abnormality detection signal ALARM is set to the level "1", the transceiver circuit 4 is set into the input mode, thereby enabling the serial external command signal $S_2$ to be input from the outside to the abnormality detecting circuit 2 by using a B-phase output signal line. When the external command signal $S_2$ is input, the microcomputer 21 executes procedures corresponding to the external command signal $S_2$ such that the cancelling of the abnormal state (reset of the R-S type flip-flop 23) and the presetting of the number of revolutions of the multi-rotation type absolute encoder (the initial value of number of revolutions which is counted is given from the outside) are instructed to the encoder main body 1 and the like. Further, when the abnormality detection signal ALARM is set to the level "1", the Z-phase pulse signal which was output from the encoder main body 1 is inverted by the exclusive OR circuit 5. Thus, in the case where an abnormality occurs in the encoder main body 1, the occurrence of the abnormality can be immediately detected from the outside.

Although an example of the encoder having outputs of A, B, and Z phases has been described above, the invention can be also applied to other encoders (general absolute encoder). The output signal lines of the selector circuit 3, transceiver circuit 4, and exclusive OR circuit 5 can be used commonly with the output signal lines of the pulse signals of the respective phases. Therefore, the number of signal lines which are led to the outside of the encoder main body 1 is the same as that in a conventional encoder.

Figure 5:
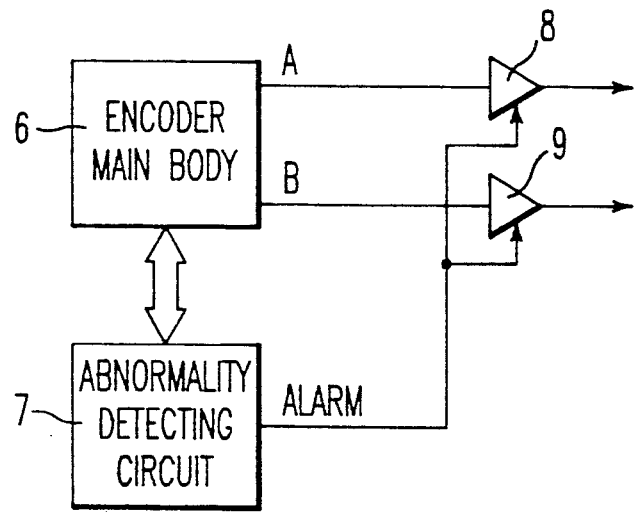
FIG. 5 is a circuit diagram showing a construction of the second embodiment of the encoder of the invention.
Figure 6:
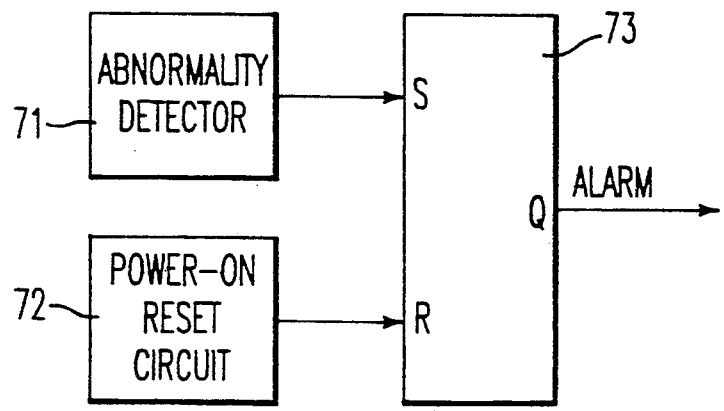
FIG. 6 is a circuit diagram of an abnormality detecting circuit 7 in FIG. 5.

The second embodiment of the invention will now be described with reference to FIGS. 5 and 6.

An encoder main body 6 is a portion corresponding to a conventional encoder and outputs pulse signals of A and B phases as outputs. An abnormality detecting circuit 7 is a circuit to detect an abnormality in the encoder main body 6 in a manner similar to the abnormality detecting circuit 2 of the first embodiment mentioned above and comprises an abnormality detector 71, a power-on reset circuit 72, and an R-S type flip-flop 73. The abnormality detecting circuit 7 outputs the abnormality detection signal ALARM which is set to the level "0" when the encoder main body is normal and which is set to the level "1" when the encoder main body is abnormal. The flip-flop 73 is set when the abnormality of the encoder main body 6 is detected by the abnormality detector 71 and the signal at the level "1" is detected. When a reset signal of a predetermined pulse width is output from the power-on reset circuit 72 at the time of turn-on of the power source of the encoder, the flip-flop 73 is reset. Both of 3-state buffers 8 and 9 are on/off controlled by the abnormality detection signal ALARM which is output from the abnormality detecting circuit 7 and are turned on when the abnormality detection signal is set to the level "0". Then, the buffers 8 and 9 output the A-phase pulse signal and the B-phase pulse signal which were output from the encoder main body 6.

The operation of the embodiment will now be described.

When the encoder main body 6 operates normally, the level of the abnormality detection signal ALARM which is output from the abnormality detecting circuit 7 is set to "0". Therefore, the A-phase and B-phase pulse signals which were output from the encoder main body 6 are output respectively to the signal processing circuit through the 3-state buffers 8 and 9, so that the position or speed is detected.

Subsequently, when the abnormality detecting circuit 7 detects some abnormality of the encoder main body 6, the level of the abnormality detection signal ALARM is set to "1". Therefore, both of the 3-state buffers 8 and 9 are set to a high impedance, the output of the A-phase and B-phase pulse signals is stopped, and the abnormality of the encoder main body 6 can be detected from the outside. Since the "0" level of the abnormality detection signal ALARM is held until the flip-flop 73 is then reset, even if the A-phase and B-phase pulse signal outputs falsely return to the normal signals, the apparatus does not malfunction. If the encoder main body 6 returned from the abnormal state, the power source is once disconnected. After that, the power source is again turned on, a reset signal is output from the power-on reset circuit 72, and the flip-flop 73 is reset, so that the A-phase and B-phase pulse signals are input to the signal processing circuit through the 3-state buffers 8 and 9.

On the other hand, an exclusive OR circuit can be also used in place of the 3-state buffers 8 and 9 in the embodiment. The abnormality detecting circuit 7 can be also achieved by software using a microcomputer. Further, as an encoder, the invention can also be obviously applied to an incremental encoder and an absolute value encoder.

While a preferred embodiment of the invention has been described using specific terms, such description is for illustrative only, and it is to be understood that changes and variations may be made without departing from the sprit or scope of the following claims.

I claim:

1. An abnormality processing circuit for an encoder comprising an abnormality detecting circuit for detecting an abnormality of the encoder and outputting an abnormality detection signal and an abnormality discrimination signal indicative of the content of the abnormality, and a selector circuit for receiving the pulse signal of a certain phase among the pulse signals which the encoder generates and outputs with the linear movement or the rotation of an object, for outputting said pulse signal when the encoder is normal, and for outputting the abnormality discrimination signal in place of said pulse signal when the abnormality detection signal is output, characterized in that a transceiver circuit is provided, which is constructed in a manner such that the pulse signal of a phase different from the phase of the pulse signal which is inputted to the selector circuit among the pulse signals is inputted, and when the encoder is normal, the transceiver circuit is set into an output mode and outputs said pulse signal having the different phase, and when the abnormality detecting signal is output, the transceiver circuit is set into an input mode, and when an external command signal appears on an output signal line of said pulse signal, the transceiver circuit receives the external command signal and outputs it to the abnormality detecting circuit, and wherein when the abnormality detecting circuit receives said external command signal, it executes a procedure indicated by the external command signal.

* * * * *